United States Patent [19]

Yabusaki et al.

[11] Patent Number: 4,825,163

[45] Date of Patent: Apr. 25, 1989

[54] QUADRATURE PROBE FOR NUCLEAR MAGNETIC RESONANCE

[75] Inventors: Masao Yabusaki, Tokyo; Etsuji Yamamoto, Akishima; Yoshiki Murakami; Hideki Kohno, both of Tokyo, all of Japan

[73] Assignee: Hitachi, Ltd., Tokyo, Japan

[21] Appl. No.: 225,781

[22] Filed: Jul. 29, 1988

[30] Foreign Application Priority Data

Jul. 31, 1987 [JP] Japan ................................. 62-190015
Apr. 13, 1988 [JP] Japan ................................. 63-89045

[51] Int. Cl.$^4$ ............................................. G01R 33/20
[52] U.S. Cl. .................................... 324/318; 324/322; 333/219
[58] Field of Search ............... 324/300, 307, 309, 318, 324/319, 322; 333/219

[56] References Cited

U.S. PATENT DOCUMENTS

| | | | |
|---|---|---|---|
| 4,641,098 | 2/1987 | Doty .................................... | 324/322 |
| 4,720,680 | 1/1988 | Nishihara et al. .................... | 324/322 |
| 4,740,751 | 4/1988 | Misic et al. .......................... | 324/322 |
| 4,755,756 | 7/1988 | Nishihara et al. .................... | 324/322 |
| 4,757,290 | 7/1988 | Keren .................................. | 324/322 |

*Primary Examiner*—Michael J. Tokar
*Attorney, Agent, or Firm*—Antonelli, Terry & Wands

[57] ABSTRACT

A quadrature probe for nuclear magnetic resonance includes two sets of coils which are combined with an angle of 90° therebetween. Four pieces of outer conductors and two pieces of ring-shaped inner conductors are capacitively coupled to each other through an insulator or an air gap. In the outer conductor(s) in at least one of a set of outer conductors disposed at positions symmetrical with respect to each other so as to form a first coil and a set of outer conductors disposed at positions symmetrical with respect to each other so as to form a second coil, a conductor member(s) for adjustment is attached in parallel to the arm portion(s) in that outer conductor(s) of that set. Alternatively, the arm portion(s) itself in that set is slidably attached to the wing portions in that set.

6 Claims, 6 Drawing Sheets

CO-AXIAL CABLE HAVING CHARACTERISTIC IMPEDANCE OF 50Ω

4,825,163

QUADRATURE PROBE FOR NUCLEAR MAGNETIC RESONANCE

BACKGROUND OF THE INVENTION

The present invention relates to an RF probe coil for nuclear magnetic resonance (NMR), and more particularly to a quadrature probe in which two sets of probe coils can be easily made orthogonal to each other.

Conventionally, X-ray computed tomography (CT) or ultrasonic imaging apparatuses have been widely used as apparatuses for non-destructively examining an internal structure such as the head or abdomen of a human body. In recent years, attempts to conduct a similar examination by use of a nuclear magnetic resonance phenomenon have given successful results and it has been found out that information unobtainable in the X-ray CT or ultrasonic imaging apparatuses can be acquired.

In an imaging system utilizing the nuclear magnetic resonance phenomenon, the improvement of efficiency of a probe coil for generating or receiving a high frequency (RF) magnetic field is an important task which brings the improvement of image quality and/or the reduction of a time required for imaging. As one approach for solving such a task has been proposed a quadrature probe coil by Journal of Magnetic Resonance, Vol. 69 (1987), pp. 236–242. In the proposed quadrature probe coil, four pieces of outer conductors and two pieces of inner conductors called guard rings are coupled to each other through a dielectric bobbin to form two sets of high frequency (RF) coils which are orthogonal to each other. When the directions of the center axes of the two sets of coils are accurately orthogonal to each other, any interference between the two sets of coils is eliminated and the probe can operate with a high efficiency. This means that a tolerance for error in fabrication of the probe is small and a long adjustment time is required for attaining the orthogonality between the center axes of the two sets of coils.

SUMMARY OF THE INVENTION

An object of the present invention is to provide a quadrature probe coil in which the adjustment for attaining or establishing the orthogonality between the center axes of two sets of coils can be easily made.

Another object of the present invention is to provide a quadrature probe coil in which the adjustment of the center axes of two sets of coils for attainment of the orthogonality therebetween causes no difference between the resonance frequencies of the two sets of coils.

An feature of the present invention lies in that in at least one of two sets of symmetrically positioned outer conductors forming two sets of coils respectively, an additional conductor(s) is slidably attached in parallel to an arm portion(s) of the outer conductor(s) in that set or the arm portion(s) itself in that set is made slidable in order to easily move a direction of the center axis of the coil.

Other features of the present invention will become apparent from the description of embodiments of the invention.

DESCRIPTION OF THE PREFERRED EMBODIMENTS

Figure 1:
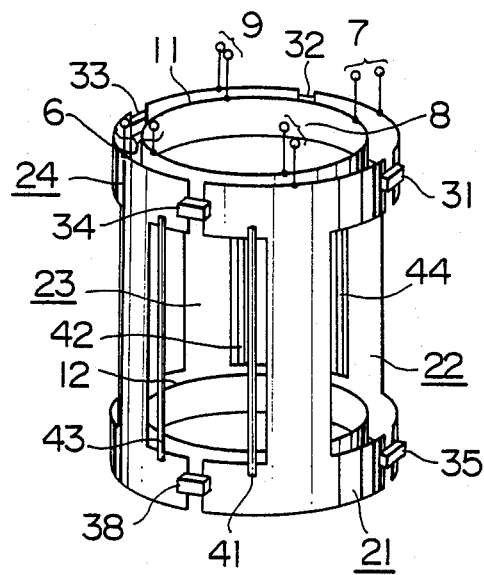
FIG. 1 is a perspective view of an embodiment of the present invention.

FIG. 1 shows a perspective view of a quadrature probe for NMR according to an embodiment of the present invention. Referring to FIG. 1, two pieces of ring-shaped inner conductors 11 and 12 also called guard rings are formed with an interval therebetween inside a cylindrical bobbin made of an insulator which is omitted for convenience' sake of illustration. On the other hand, four pieces of outer conductors 21, 22, 23 and 24 are formed outside the bobbin. The outer conductors 21 and 23 are disposed at positions symmetrical with respect to the center axis of the cylindrical bobbin. Similarly, the outer conductors 22 and 24 are disposed at positions symmetrical with respect to the center axis of the cylindrical bobbin. Each of the outer conductors 21 to 24 includes an arm portion parallel to the center axis of the cylindrical bobbin and four wing portions extending rightwards and leftwards from opposite ends of the arm portion. The total length of two or right and left wing portions of each outer conductor is slightly smaller than one-fourth of the outer periphery of the bobbin. Namely, the end of the right or left wing portion of any given outer conductor is positioned in proximity of the end of the left or right wing portion of an outer conductor adjacent to the given outer conductor. The adjacent ends of the wing portions between the outer conductors are capacitively coupled by capacitors 31, 32, 33, 34, 35, 36, 37 and 38 by which a resonance frequency of the probe can be adjusted. The wing portions of the outer conductors are disposed at positions opposite to the guard rings 11 and 12 so that capacitive couplings are formed between the wing portions of the outer conductors and the guard rings through the bobbin. Alternatively, capacitive couplings through an air gap may be employed. Thus, the outer conductors 21 and 23 are coupled to each other through the guard rings 11 and 12, thereby forming a first probe coil. A second probe coil having its center axis orthogonal to the center axis of the first probe coil is formed by the outer conductors 22 and 24 and the guard rings 11 and 12. To the first probe coil are to be connected a transmitter and a receiver through terminal pair 8 or 9. To the second probe coil are to be connected a transmitter and a receiver through terminal pair 6 or 7. In order to adjust the directions of the center axis of the first and second probe coils, the four pieces of outer conductors 21, 22, 23 and 24 have respective copper pipes 41, 42, 43 and 44 attached thereto in parallel to the arm portions thereof. Opposite ends of each copper pipe are electrically connected to the upper and lower wing portions of the associated outer conductor and the copper pipe is slidably mounted so that a mounting position can be adjusted freely.

Figure 2:
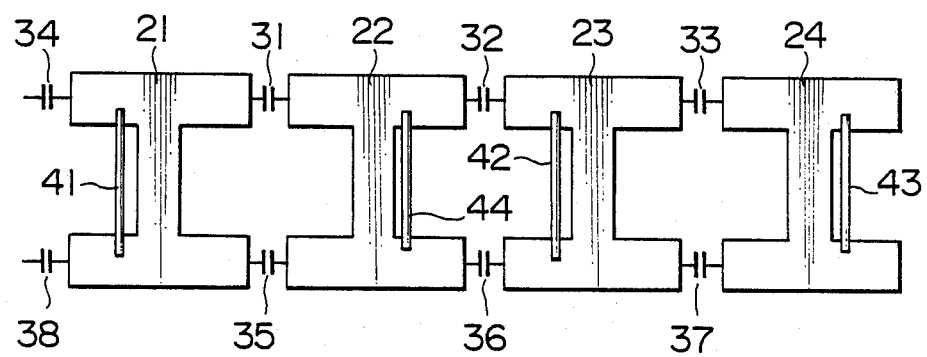
FIG. 2 is an exploded view of outer conductors in the embodiment shown in FIG. 1.
Figure 3A:
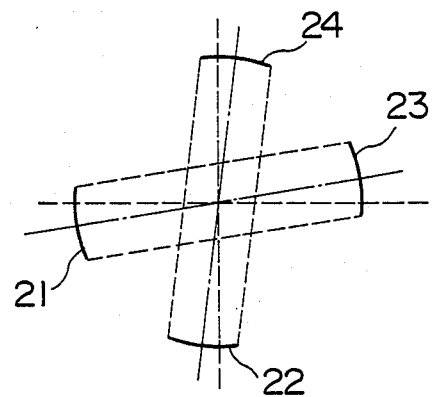
FIGS. 3A and 3B are cross-sectional views for explaining a coil center-axis adjusting function in the embodiment shown in FIG. 1.
Figure 3B:
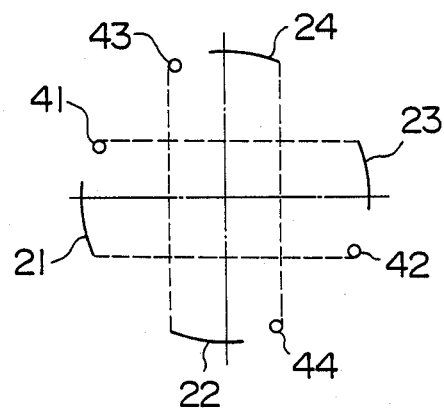

FIG. 2 is an exploded view of the outer conductors and the copper pipes shown in FIG. 1. FIG. 3a shows a relationship between the center axes of the first and second probe coils before the copper pipes 41, 42, 43 and 44 are mounted and FIG. 3b shows a relationship between the center axes of the first and second probe coils after the copper pipes 41, 42, 43 and 44 are mounted. Before the copper pipes 41, 42, 43 and 44 are mounted, there may be a case in which the center axis of the probe coil pair including the outer conductors 22 and 24 and the center axis of the probe coil pair including the outer conductors 21 and 23 are not orthogonal to each other, as shown by FIG. 3a. On the other hand, if the copper pipes 41, 42, 43 and 44 are mounted to the outer conductors 21, 22, 23 and 24, respectively, as shown in FIGS. 1 and 2, new electrical flow paths are formed in the outer conductors 21, 23, 24 and 22 by virtue of the copper pipes 41, 42, 43 and 44, as shown in FIG. 3b and hence it is possible to make the center axis of the probe coil pair inclusive of the outer conductors 21 and 23 and the center axis of the probe coil pair inclusive of the outer conductors 24 and 22 orthogonal to each other in such a manner that the center axis of the probe coil pair of the outer conductors 21 and 23 and the center axis of the probe coil pair of the outer conductors 24 and 22 are rotated by adjusting the mounting positions of the copper pipes 41, 42, 43 and 44 and without moving the outer conductors 21, 23, 24 and 22.

Instead of the above-mentioned construction can be employed a construction in which only one of the two probe coil pairs (for example, the probe coil pair including the outer conductors 21 and 23) is provided with the copper pipes (for example, 41 and 42). Even in such a case, the adjustment for making the center axes of the two probe coil pairs orthogonal to each other can be made easily though new electrical flow paths are formed in only one of the two probe coil pairs with a change in inductance and hence a difference in resonance frequency between the two probe coil pairs. The provision of the copper pipes to both the two probe coil pairs as in the above-mentioned embodiment allows the coincidence in resonance frequency between the two probe coil pairs or the coincidence in characteristic between the two probe coil pairs.

In the above-mentioned embodiment, two copper pipes have been provided to each of the two probe coil pairs. However, the adjustment can be made even in the case where one copper pipe is provided to each probe coil pair. Also, though the copper pipes have been used as conductor members, any metal material and shape may be used for the conductor member so long as the material is non-magnetic. For example, a bar-shaped member can be used in place of the pipe-shaped member.

Figure 4:
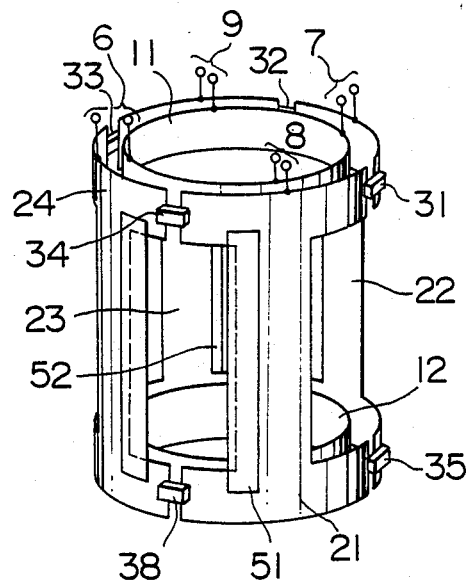
FIGS. 4 and 5 are perspective and exploded views of another embodiment of the present invention.
Figure 5:
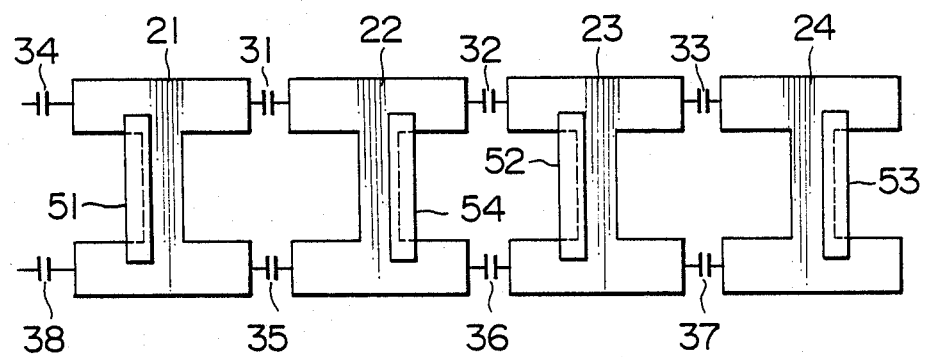

FIGS. 4 and 5 show another embodiment of the present invention in which copper plates 51, 52, 53 and 54 are used in place of the copper pipes 41, 42, 43 and 44 shown in FIGS. 1 and 2. Though in the present embodiment two copper plates are provided to each probe coil pair, it is of course that the adjustment can be made even if one copper plate is provided to each probe coil pair, like the explanation made in conjunction with the embodiment shown in FIGS. 1 and 2.

Figure 6:
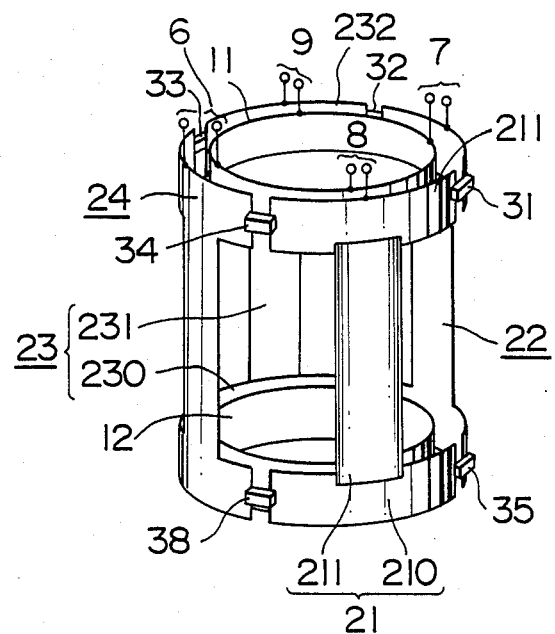
FIGS. 6 and 7 are perspective and exploded views of still another embodiment of the present invention.
Figure 7:
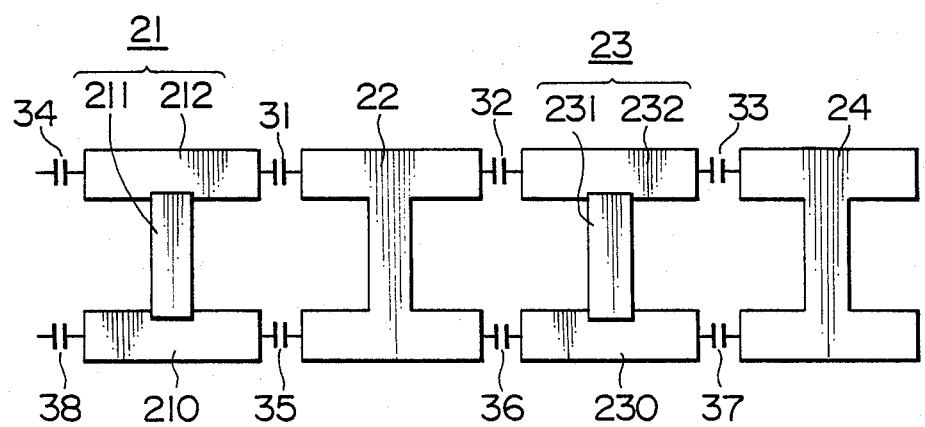

FIGS. 6 and 7 show still another embodiment of the present invention. In the embodiment shown in FIGS. 1 and 2 and the embodiment shown in FIGS. 4 and 5, additional conductor members have been mounted to the outer conductors and the adjustment of the directions of the center axes of the probe coil pairs has been made in accordance with the mounting positions of the additional conductor members. In the embodiment shown in FIGS. 6 and 7, an outer conductor 21 is constructed by wing portions 210 and 212 made of separate conductors and an arm portion 211 connected thereto. Opposite ends of the arm portion 211 are slidably connected to the wing portions 210 and 212. Like the outer conductor 21, an outer conductor 23 is constructed by fixed wing portions 230 and 232 and an arm portion 231 slidably connected thereto. The other reference numerals used in FIGS. 6 and 7 represent components which are identical to those explained in conjunction with the embodiment shown in FIGS. 1 and 2. In the present embodiment, the direction of the center axis of a first probe coil pair formed by the outer conductor 21 and 23 and the guard rings 11 and 12 can be adjusted by adjusting the positions of the arm portions 211 and 231, thereby allowing the adjustment of the orthogonality to the center axis of a second probe coil pair formed by the outer conductors 22 and 24 and the guard rings 11 and 12.

Figure 8:
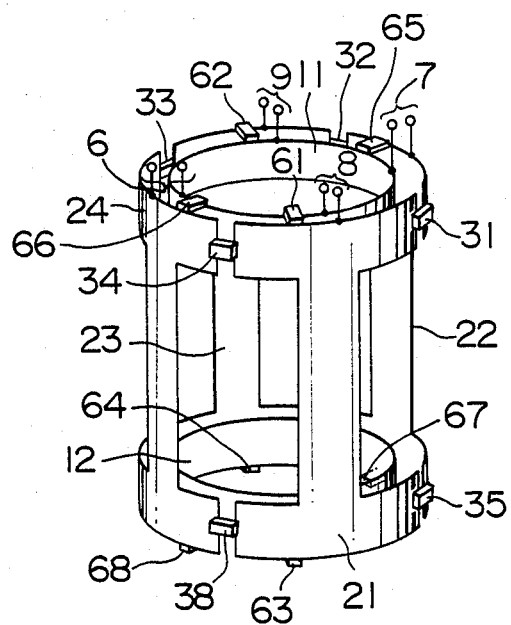
FIGS. 8, 9A and 9B are perspective, top and bottom views of a further embodiment of the present invention.
Figure 9A:
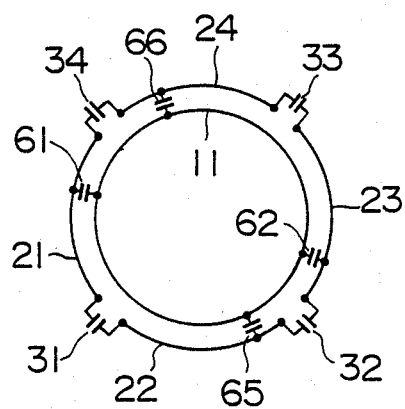
Figure 9B:
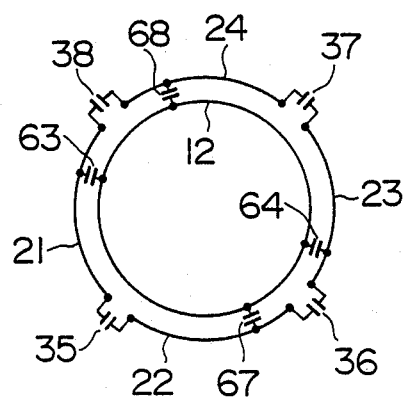

FIGS. 8 and 9 show a further embodiment of the present invention. In the present embodiment, capacitors 61, 62, 63, 64, 65, 66, 67 and 68 are inserted between outer conductors 21, 23, 22, 24 and guard rings 11, 12 to form flow paths between the guard rings 11, 12 and the outer conductors 21, 23, 22 and 24 and the center axes of two probe coil pairs are rotated. FIG. 9a shows a relationship between the guard ring 11, the outer conductors 21, 23, 22, 24 and the capacitors 61, 62, 65, 66 and FIG. 9b shows a relationship between the guard ring 12, the outer conductors 21, 23, 22, 24 and the capacitors 63, 64, 67, 68. By disposing or mounting the capacitors 61, 62, 63, 64, 65, 66, 67 and 68 at positions shifted from the geometrical center axes of the probe coil pairs, as shown in FIGS. 9a and 9b, the center axes of the probe coil pairs can be rotated respectively so that the center axes become orthogonal to each other.

Figure 10:
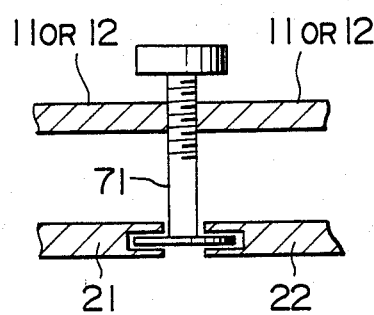
FIGS. 10 and 11 are cross-sectional and top views of a still further embodiment of the present invention.
Figure 11:
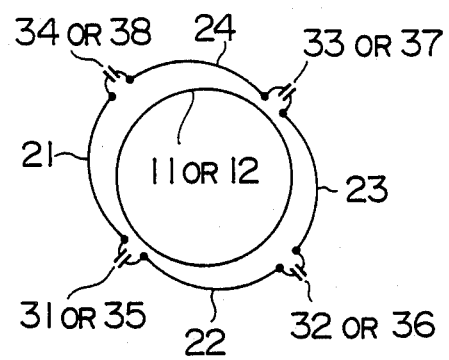

FIGS. 10 and 11 show a still further embodiment of the present invention. In the present embodiment, the adjustment of the orghogonality of two probe coil pairs is made through the adjustment of spaces between guard rings 11, 12 and outer conductors 21, 22, 23, 24 instead of the additional provision of the capacitors 61, 62, 63 64, 65, 66, 67 and 68 as shown in FIGS. 8 and 9. In the embodiment shown in FIG. 8, the outer conductors 21, 22, 23 and 24 have been fixed to the bobbin. In the present embodiment, on the other hand, the end of each wing portion of any outer conductor is held by a screw 71 capable of adjusting a distance between the outer conductor and the guard ring 11 or 12, as shown in FIG. 10. With such a construction, the center axes of the two probe coil pairs can be rotated respectively or the orthogonality of the center axes of the two probe coil pairs can be adjusted by making a space between each of the outer conductors 21, 22, 23 and 24 and the guard ring 11 or 12 narrow at its one end to provide an increased capacitance and wide at the other end to provide a decreased capacitance, as shown in FIG. 11.

Figure 12:
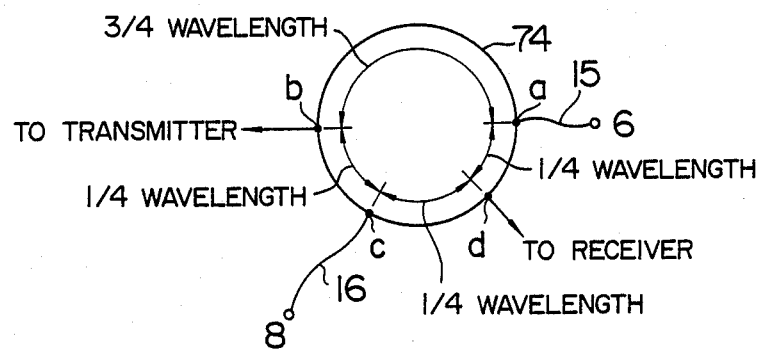
FIGS. 12, 13 and 14 are circuit diagrams showing the connection between a coil probe and a transmitter/receiver.
Figure 13:
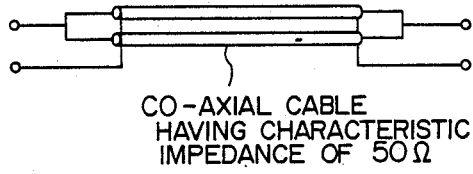
Figure 14:
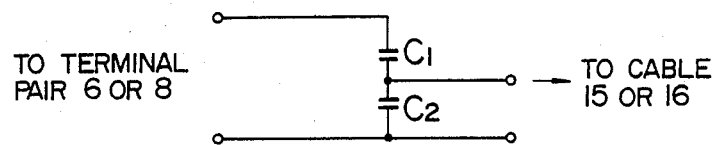

FIG. 12 shows how the above-mentioned quadrature probes are connected to a transmitter and a receiver. A point a on a ring-like cable 74 one circle or circuit of which corresponds to 6/4 wavelength is connected to the terminal pair 6 of the probe coil through a cable 15. To a point b distanced from the point a by ¾ wavelength is connected a transmitter. A point c distanced from the point b by ¼ wavelength is connected to the terminal pair 8 of the probe coil through a cable 16. To a point d distanced from the point c by ¼ wavelength and also from the point a by ¼ wavelength is connected a receiver. The terminal pairs 7 and 9 of the probe coil are not used. The cable 16 has a length greater than the cable 15 by ¼ wavelength so that a phase difference of 90° is produced at a termination point. Since each of the output impedance of the transmitter and the input impedance of the receiver is usually 50 Δ, it is required that the characteristic impedance of each of the cables 15 and 16 is 25 Δ. This requirement can be satisfied by connecting cables with characteristic impedances of 50 Δ in parallel to each other as shown in FIG. 13. As has been mentioned, it is necessary that the lengths of the cables 15 and 16 are different from each other by ¼ wavelength. Further, it is preferable that the length of the cable 15 is not greater than 1/10 wavelength. FIG. 14 shows the connection of the cable 15 or 16 inclusive of an impedance converting circuit and the probe coil. Though the cable 15 or 16 is connected to the terminal pair 6 or 8 of the probe coil, a capacitor inserted in parallel to the terminal pair 6 or 8 for impedance conversion is divided into two parts. Namely, assuming that the value of a capacitor to be primarily or intrinsically inserted in parallel to the terminal pair 6 or 8 is C and the values of partitive capacitors are $C_1$ and $C_2$, the values of $C_1$ and $C_2$ are selected such that the intrinsic capacitor C and the partitive capacitors $C_1$ and $C_2$ become substantially equivalent to each other or such that the equation $$C = C_1 C_2 / (C_1 + C_2) \tag{1}$$

is satisfied. Also, the impedance substantially reduces in inverse proportion to the second power of a ratio of $C_1$ to $C_2$, it is possible to select $C_1$ and $C_2$ such that they satisfy the equation (1) and a desired impedance value is provided.

The above selection or adjustment of $C_1$ and $C_2$ can be carried out independently at the terminal pair 6 and the terminal pair 8. Therefore, a required adjustment can be completed during a time remarkably short as compared with the conventional method.

According to the present invention, there are provided effects that a fine adjustment for providing the orthogonality of two coils which is important in constructing a quadrature probe can be performed for a short time and easily, that any interference between two coils in the quadrature probe can be prevented, and that the characteristics of the two coils can be made coinident with each other.

We claim:

1. A quadrature probe for nuclear magnetic resonance, comprising:
   (a) first to fourth outer conductors provided along a predetermined cylindrical surface, each of said first to fourth outer conductors including one arm portion parallel to a center axis of said cylindrical surface and four wing portions extending rightwards and leftwards from opposite ends of said arm portion, said first and third outer conductors being disposed at positions symmetrical with respect to said center axis, said second and fourth outer conductors being disposed at positions symmetrical with respect to said center axis;
   (b) first and second ring-shaped inner conductors provided inside the wing portions of said first to fourth outer conductors, each of said first and second inner conductors being capacitively coupled to the wing portions of said outer conductors through an insulator or an air gap so that said first and third outer conductors form a first coil and that said second and fourth outer conductors form a second coil;
   (c) capacitors inserted between ends of the wing portions of the adjacent ones of said first to fourth outer conductors; and
   (d) a conductor member provided to at least one of a set of said first and third outer conductors and a set of said second and fourth outer conductors for adjustment of the direction of the center axis of a coil, opposite ends of said conductor member being slidably attached to the upper and lower wing portions of the outer conductor.

2. A quadrature probe for nuclear magnetic resonance according to claim 1, wherein said conductor member is provided to each of said first to fourth outer conductors.

3. A quadrature probe for nuclear magnetic resonance according to claim 1, wherein said conductor member is provided to each of the set of said first and third outer conductors and the set of said second and fourth outer conductors.

4. A quadrature probe for nuclear magnetic resonance according to claim 1, wherein said first coil is connected to a transmitter and a receiver through a first terminal pair formed at one end of said arm portion of one of said first and third outer conductors and said second coil is connected to said transmitter and said receiver through a second terminal pair formed at one end of said arm portion of one of said second and fourth outer conductors.

5. A quadrature probe for nuclear magnetic resonance, comprising:
   (a) first to fourth outer conductors provided along a predetermined cylindrical surface, each of said first to fourth outer conductors including one arm portion parallel to a center axis of said cylindrical surface and four wing portions extending rightwards and leftwards from opposite ends of said arm portion, said first and third outer conductors being disposed at positions symmetrical with respect to said center axis, said second and fourth outer conductors being disposed at positions symmetrical with respect to said center axis;
   (b) first and second ring-shaped inner conductors provided inside the wing portions of said first to fourth outer conductors, each of said first and second inner conductors being capacitively coupled to the wing portions of said outer conductors through an insulator or an air gap so that said first and third outer conductors form a first coil and that said second and fourth outer conductors form a second coil;
   (c) capacitors inserted between ends of the wing portions of the adjacent ones of said first to fourth outer conductors; and
   (d) the arm portion and the wing portions in at least one of a set of said first and third outer conductors and a set of said second and fourth outer conductors being formed by separate conductors and the arm portion being slidably attached to the wing portions.

6. A quadrature probe for nuclear magnetic resonance according to claim 5, wherein said first coil is connected to a transmitter and a receiver through a first terminal pair formed at one end of said arm portion of one of said first and third outer conductors and said second coil is connected to said transmitter and said receiver through a second terminal pair formed at one end of said arm portion of one of said second and fourth outer conductors.

* * * * *